(12) United States Patent
Brenot et al.

(10) Patent No.: US 9,197,325 B2
(45) Date of Patent: Nov. 24, 2015

(54) OPTICAL TRANSCEIVER

(71) Applicant: Commissariat a l'Energie Atomique et aux Energies Alternatives, Paris (FR)

(72) Inventors: Romain Brenot, Palaiseau (FR); Nicolas Chimot, Palaiseau (FR)

(73) Assignee: Alcatel Lucent and Commissariat A L'Energie Atomique Et Aux Energies Alternatives (FR)

( * ) Notice: Subject to any disclaimer, the term of this patent is extended or adjusted under 35 U.S.C. 154(b) by 0 days.

(21) Appl. No.: 14/194,043

(22) Filed: Feb. 28, 2014

(65) Prior Publication Data

US 2014/0328590 A1  Nov. 6, 2014

(30) Foreign Application Priority Data

Feb. 28, 2013 (EP) .................................... 13305229

(51) Int. Cl.
| | |
|---|---|
| *H04B 10/00* | (2013.01) |
| *H04B 10/40* | (2013.01) |
| *H04J 14/02* | (2006.01) |
| *H01S 5/14* | (2006.01) |
| *G02B 6/42* | (2006.01) |
| *H01S 5/026* | (2006.01) |
| *H01S 5/065* | (2006.01) |

(52) U.S. Cl.
CPC ................ *H04B 10/40* (2013.01); *H01S 5/142* (2013.01); *H04J 14/02* (2013.01); *G02B 6/4246* (2013.01); *H01S 5/026* (2013.01); *H01S 5/0265* (2013.01); *H01S 5/0656* (2013.01)

(58) Field of Classification Search
CPC ..... H04B 10/40; H04B 10/43; H04J 14/0232; H04J 14/0235; H04J 14/0239; H04J 14/0245; H04J 14/0246; H04J 14/0249

USPC ............ 398/135, 136, 138, 139, 137, 85, 82, 398/87, 68, 71, 72, 100, 66, 42; 372/20, 26, 372/94, 32, 36, 38.02

See application file for complete search history.

(56) References Cited

U.S. PATENT DOCUMENTS

| | | | |
|---|---|---|---|
| 2007/0110453 A1* | 5/2007 | Akiyama et al. | ............... 398/182 |
| 2008/0240725 A1 | 10/2008 | Yokoyama | |
| 2009/0285251 A1 | 11/2009 | Yamazaki | |
| 2010/0021171 A1 | 1/2010 | Wang et al. | |
| 2012/0008958 A1* | 1/2012 | Dahlfort et al. | .................. 398/85 |

FOREIGN PATENT DOCUMENTS

| | | |
|---|---|---|
| EP | 1699118 A2 | 9/2006 |
| WO | 2010107350 A1 | 9/2010 |

* cited by examiner

*Primary Examiner* — Hanh Phan
(74) *Attorney, Agent, or Firm* — Blank Rome LLP

(57) ABSTRACT

An optical transceiver (1) comprises:
a ring resonator (6),
a first waveguide (2) comprising, in succession, an input-output section (22), a coupling section (20) coupled to a first portion of the ring resonator and an amplification section (21) coupled to a first optical reflector (4) suitable for reflecting light toward the coupling section,
a second waveguide (5) comprising, in succession, a reception section (52), a coupling section (50) coupled to a second portion of the ring resonator and a reflection section coupled to a second optical reflector (4) suitable for reflecting light toward the coupling section,
a gain medium (7) arranged in the amplification section of the first waveguide and suitable for producing a stimulated light transmission, and
an optical detector (8) coupled to the reception section of the second waveguide.

15 Claims, 3 Drawing Sheets

OPTICAL TRANSCEIVER

TECHNICAL FIELD

The invention relates to the field of optical communications, and more particularly to optical transceiver devices that can be used to transmit and receive modulated optical communication signals.

TECHNOLOGICAL BACKGROUND

Control of the optical wavelength division multiplexing (WDM) optical fiber transmission technology is an important factor in meeting the growing bit rate requirements in information transmission. Wavelength division multiplexing, hereinafter called WDM, consists in combining, on one and the same fiber, a plurality of modulated signals each carried by a channel with different wavelength. Thus, the overall bit rate of a transmission line is equal to the sum of the bit rates of the different signals. However, WDM demands accurate control of the wavelengths used, both in transmission and in reception. Transmission over a badly controlled wavelength channel can in fact create interference with another signal present on the line, and therefore cause degradation to both signals, also called spectral collision. The reception of a signal over a channel with badly controlled wavelength by a receiver can cause the quality of the reception to be reduced or a signal other than that which was actually intended for the receiver to be detected. Optical transmitters and receivers that have a fixed or tunable operating wavelength can be used in WDM networks.

SUMMARY

One idea behind the invention is to provide an optical transceiver in which a transmission wavelength and a reception wavelength exhibit a well controlled difference.

According to one embodiment, the invention provides an optical transceiver comprising:
a ring resonator,
a first waveguide comprising, in succession, an input-output section, a coupling section coupled to a first portion of the ring resonator and an amplification section coupled to a first optical reflector, the first optical reflector being suitable for reflecting light toward the coupling section,
a second waveguide comprising, in succession, a reception section, a coupling section coupled to a second portion of the ring resonator and a reflection section coupled to a second optical reflector, the second optical reflector being suitable for reflecting light toward the coupling section,
a gain medium arranged in the amplification section of the first waveguide and suitable for producing a stimulated light transmission, and
an optical detector coupled to the reception section of the second waveguide.

By virtue of these features, the ring resonator produces a coupling between the amplification section and the reflection section. A laser cavity is thus produced between the two optical reflectors, via the amplification section, the first coupling section, the ring resonator, the second coupling section and the reflection section. The laser signal generated when the gain medium is activated, that is to say supplied with energy, for example by an electrical voltage, can exit outward through the input-output section of the first waveguide. The Fabry-Pérot resonant modes of this laser cavity depend on the characteristics of the ring resonator. By changing the characteristics of the ring resonator, for example its refractive index, it is possible to change the optical resonance wavelength(s), and therefore produce a wavelength-tunable source.

By virtue of these features, the ring resonator also produces a coupling between the input-output section and the reception section, so that it is possible to detect, with the optical detector, an optical signal received through the input-output section from an external source. The ring resonator acts in both cases as a periodic frequency-domain filter, which allows the passage of a plurality of relatively narrow optical frequency bands spaced apart by a fixed interval called free spectral interval of the ring resonator. This interval, which depends on the design and the geometry of the ring resonator, can be controlled with high accuracy. It is also possible to set the absolute position of these optical frequency bands by changing the characteristics of the ring resonator, for example its refractive index, so as to produce a wavelength-tunable receiver.

It is thus possible to obtain an optical transceiver suitable for transmitting a laser radiation on a first resonant wavelength and for detecting an optical signal received on a second resonant wavelength, in which the difference between the first resonant wavelength and the second resonant wavelength is equal to one or an integer multiple of the free spectral interval of the ring resonator. This way, this difference can be accurately controlled through an equally accurate and controlled production of the ring resonator.

According to embodiments, such an optical transceiver can comprise one or more of the following features.

According to one embodiment, the transceiver also comprises a wavelength setting mechanism suitable for modifying a physical property of the ring resonator to set the resonance frequency or frequencies of the ring resonator. For this, properties such as the optical length or the refractive index of the ring resonator can be modified in this way. According to one embodiment, the wavelength setting mechanism is suitable for injecting an electrical current into the ring resonator. According to another embodiment, the wavelength setting mechanism is suitable for modifying the temperature of the ring resonator to change the refractive index of the ring resonator by thermo-optical effect. According to one embodiment, the optical transceiver comprises a heating film deposited on the ring resonator.

By virtue of these features, given that the free spectral interval of the ring resonator can be kept essentially fixed through the temperature modifications, it is possible to simultaneously set a first resonant wavelength used for the transmission of an optical signal and a second resonant wavelength used for the reception of an optical signal by the transceiver, without changing the difference between these two resonant wavelengths. It is thus possible to implement relatively economical wavelength tuning methods, by explicitly setting one of the two resonant wavelengths, which produces an implicit setting of the other resonant wavelength without any actual detection of this other resonant wavelength being implemented.

For example, an operation for tuning the resonant wavelength received by the detector, in which the optical signal is effectively detected at the detector, intrinsically produces a corresponding tuning of the resonant wavelength transmitted by the laser cavity, and does so without it being necessary to detect or analyze an optical signal transmitted by the laser cavity of the transceiver. This is due to the fact that it is possible to know, accurately and without difficulty, the free spectral interval of the ring resonator which governs the fixed difference between these two resonant wavelengths.

Parameters such as the material and the geometry of the ring resonator make it possible to set the free spectral interval of the ring resonator at the time of its design.

Because of the periodic spectrum of the ring resonator, it may be, at least in theory, that the laser cavity transmits simultaneously amplified optical signals on a plurality of resonant wavelengths. To avoid this and obtain in particular a single and well controlled transmission wavelength, characteristics of the gain medium and of the ring resonator, notably its fineness, can be carefully chosen. According to a corresponding embodiment, the geometry is such that the spectral width of a resonant mode of the ring resonator is less than the free spectral interval of the laser cavity.

The spectral width of the gain medium also influences the mode selection by the laser cavity. Parameters such as the material and the geometry of the gain medium make it possible to set the spectral width of the gain medium at the time of its design. Preferably, for a single mode to be amplified, the spectral width of the gain medium is less than the free spectral interval of the ring resonator.

According to one embodiment, the gain medium comprises a material with quantum wells.

According to one embodiment, the optical transceiver also comprises a substrate on which the ring resonator, the first waveguide and the second waveguide are integrated in a monolithic manner. According to one embodiment, the substrate is made of silicon or of InP material.

According to one embodiment, the optical transceiver also comprises a reflecting film deposited on an end surface of the substrate and forming the first and second optical reflectors.

According to one embodiment, the optical transceiver also comprises an optical modulator coupled to the first waveguide to modulate an optical signal generated by the gain medium. Such an optical modulator can be produced in an integrated manner with the gain medium by directly performing a gain control corresponding to the data to be transmitted, or externally to the gain medium, for example in the form of an electro-absorption modulator arranged in the first waveguide.

According to one embodiment, the optical transceiver also comprises a control unit suitable for controlling the gain of the gain medium, for example by setting a pumping current, and/or other elements of the optical transceiver, such as the optical detector, the wavelength setting mechanism, the optical modulator and other elements.

According to one embodiment, the optical transceiver also comprises a spectral filter arranged in the reception section upstream of the optical detector to allow the passage of an optical signal to be received by the optical detector and to block an optical signal to be transmitted by the transceiver. According to one embodiment, the spectral filter is a low-pass filter, the wavelength of the signal to be received being greater than the wavelength of the signal to be transmitted.

According to one embodiment, the invention also provides a method for operating an abovementioned optical transceiver, in which in a transmitter operating mode in which the gain medium is activated, the optical transceiver transmits outward, through the input-output section, a monochromatic optical signal having a first carrier wavelength, and in a receiver operating mode, in which the gain medium can be deactivated, the optical transceiver receives, from the outside, through the input-output section, an optical signal comprising a monochromatic component having a second carrier wavelength, the difference between the first carrier wavelength and the second carrier wavelength being equal to the free spectral interval of the ring resonator or an integer multiple thereof.

According to one embodiment, the input-output section of the optical transceiver is linked by an optical network to a communication node, in which the monochromatic optical signal having the first carrier wavelength is modulated with an uplink data stream and transports the uplink data stream from the optical transceiver to the communication node, and in which the monochromatic component having the second carrier wavelength is modulated with a downlink data stream and transports the downlink data stream from the communication node to the optical transceiver.

According to one embodiment the transmitter operating mode and the receiver operating mode are used alternately according to a periodic time-division duplexing scheme. According to another embodiment, the transmitter operating mode and the receiver operating mode are used simultaneously according to a spectral duplexing scheme.

Some aspects of the invention stem from the idea of coupling a resonant optical filter both to a source and to an optical detector so as to lock the operating wavelength of the source and of the receiver as a function of the free spectral interval of the optical resonator.

Some aspects of the invention stem from the idea of producing an optical filter that makes it possible to simultaneously set a transmission carrier wavelength and a reception carrier wavelength that exhibit a predetermined difference relative to one another. Some aspects of the invention stem from the idea of producing the source, the detector and this optical filter in an integrated manner.

BRIEF DESCRIPTION OF THE FIGURES

The invention will be better understood, and other aims, details, features and advantages thereof will become more clearly apparent from the following description of a number of particular embodiments of the invention, given purely as illustrative and nonlimiting examples, with reference to the attached drawings.

DETAILED DESCRIPTION OF EMBODIMENTS

Figure 1:
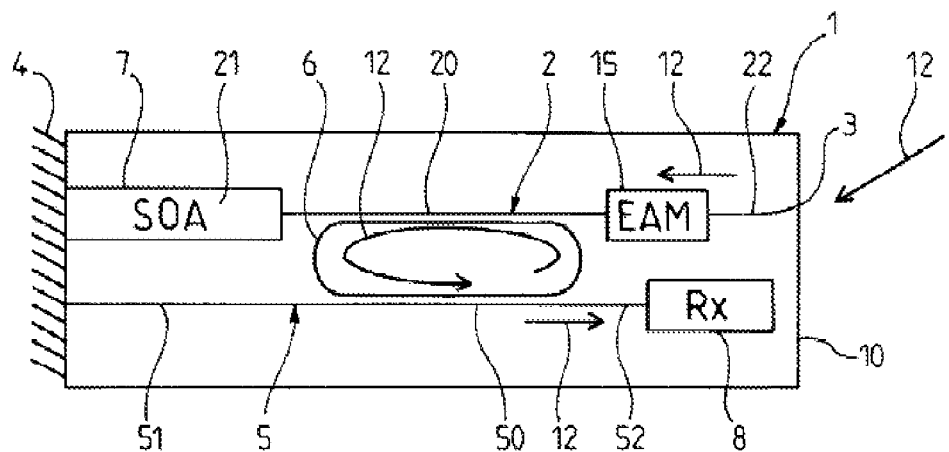
FIG. 1 is a functional schematic representation of an integrated optical transceiver according to one embodiment.

With reference to FIG. 1, an optical transceiver 1 is represented that has been fabricated in an integrated manner on a substrate 10. A first waveguide 2 extends in a rectilinear manner between an input/output port 3, situated at a longitudinal end of the substrate 10 and a reflective film 4, for example a multilayer dielectric, arranged on an opposite longitudinal end of the substrate 10. A second waveguide 5 extends parallel to the waveguide 2 at a distance therefrom and a ring resonator 6 is arranged between the two waveguides 2 and 5 to produce a coupling between them. The ring resonator 6 is a waveguide closed on itself, for example of circular form.

More specifically, a portion of the ring resonator 6 is coupled with an intermediate section 20 of the waveguide 2 situated between an amplification section 21 extending on the side of the reflective film 4 and an input/output section 22 extending on the side of the port 3. Similarly, an opposite portion of the ring resonator 6 is coupled with an intermediate section 50 of the waveguide 5 situated between a reflection section 51 extending on the side of the reflective film 4 and a reception section 52 extending on the side of the port 3.

The reception section 52 culminates at a photodetector 8, for example a photodiode, making it possible to detect an incoming optical signal received from the outside through the port 3. The arrows 12 of FIG. 1 schematically represent the propagation path followed by such an incoming signal, namely in the input/output section 22, in the intermediate section 20, in the ring resonator 6, in the intermediate section 50 and in the reception section 52. The passage in the ring resonator 6 provokes a spectral filtering because of the resonance properties of the ring.

The amplification section 21 of the waveguide 2 contains a light-amplifying material 7, for example a semiconductor material in which a population inversion can be produced by current injection, so as to form a semiconductor optical amplifier, or SOA. A Fabry-Pérot cavity is thus formed between the two areas of the reflective film 4 respectively terminating the waveguide 2 and the waveguide 5, via the ring resonator 6, which makes it possible to produce a laser radiation by virtue of the amplification by the SOA of one or more resonant modes of the cavity.

Figure 2:
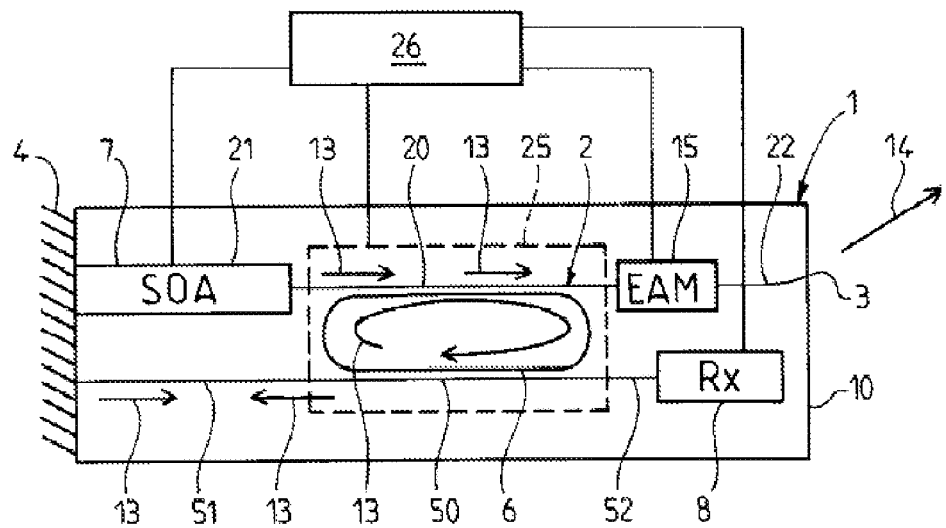
FIG. 2 is a representation similar to FIG. 1 also showing control means for the optical transceiver according to one embodiment.

The arrows 13 of FIG. 2 schematically represent the propagation path followed by such a laser radiation, namely in the amplification section 21, in the intermediate section 20, in the ring resonator 6, in the intermediate section 50, in the reflection section 51 and return in the reverse direction by reflection on the reflector 4. The passage in the ring resonator 6 provokes a spectral filtering because of the resonance properties of the ring. In addition, because the coupling is not perfect between the ring resonator 6 and the waveguide 2, a portion of the dually amplified light is propagated through the input/output section 22 and the port 3, thus constituting an outgoing signal 14.

To modulate the outgoing signal 14, it is possible to provide an electro-absorption modulator 15 interposed in the input/output section 22 or a direct modulation of the gain of the amplification section 21.

Figure 3:
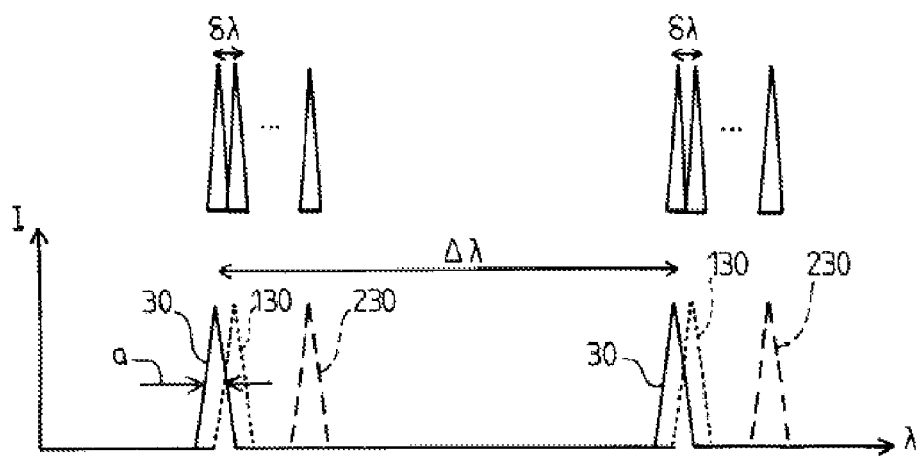
FIG. 3 is a graphic representation of the carrier wavelengths having been transmitted and received by the optical transceiver of FIG. 2.

The frequency-domain filtering provoked by the ring resonator 6 in transmission and in reception exhibits a periodic transfer function schematically represented by a continuous line in FIG. 3. In FIG. 3, the x axis represents the wavelength λ, and the y axis represents the intensity I transmitted by the ring resonator 6. This transfer function takes the form of a succession of passing rays 30 spaced apart periodically by an interval Δλ called free spectral interval of the ring resonator 6. The rays 30 characterize the carrier wavelengths on which the optical transceiver 1 could receive or transmit light. The width a of the rays 30 and their mutual spacing Δλ can be accurately dimensioned by a corresponding dimensioning of the ring resonator 6. In quality terms, the free spectral interval Δλ is inversely proportional to the size of the ring.

A free spectral interval Δλ that is relatively high, for example of the order of 30 nm or more, can be obtained by a ring 6 of small size. The silicon substrate etching techniques are relatively advantageous in this respect. An InP substrate can also be envisaged.

Preferably, the laser cavity is designed to radiate a single longitudinal mode. This mode selection can be made by the dimensioning of the elements, namely, in particular, by satisfying the following conditions:
 Free spectral interval of the laser cavity less than the width a of a ray 30 of the ring resonator 6.
 Spectral width of the amplification section 21 less than the free spectral interval Δλ of the ring resonator 6.

When the laser radiates as indicated above, it is normal for the photodetector 8 to receive a light intensity that is substantial at the transmission wavelength, because of the imperfect coupling between the ring resonator 6 and the waveguide 5. However, because of the periodicity of the transfer function of FIG. 3, the photodetector 8 is also capable of receiving an incoming signal carried by a wavelength that is different from the transmission wavelength, greater or smaller, for which the difference from the transmission wavelength is an integer multiple at the free spectral interval Δλ. This reception is not, however, possible if the photodetector 8 is already saturated by the transmitted laser radiation.

According to an embodiment that is in particular suitable for networks with time-division duplexing, the photodetector 8 is operated in a reception phase in which the SOA is deactivated so that no laser signal is transmitted. Conversely, the amplification section 21 is operated only during a transmission phase. During the transmission phase, the photodetector 8 is not operated, or at least only to measure the level of the transmitted signal.

The optical transceiver 1 described above can be provided with a wavelength setting function. Returning to FIG. 2, a heating metal film 25 is schematically represented, arranged on the ring 6 and making it possible to vary its refractive index by thermo-optical effect. For example, for a ring 6 exhibiting a free spectral interval Δλ of 30 nm, an index variation of up to $10^{-3}$ makes it possible to shift the rays 30 by approximately 60 GHz. Since the interval Δλ does not vary substantially during such a setting, all the rays 30 are offset by the same setting quantity δλ.

FIG. 3 schematically represents a setting quantity δλ and, by a dotted line, the rays 130 of the transfer function obtained after the setting. The rays 230 shown as a broken line represent the transfer function obtained after a greater setting. Generally, the maximum setting margin for the wavelengths is less than the free spectral interval Δλ, but not necessarily.

FIG. 2 schematically represents a control unit 26 for the optical transceiver 1. The control unit 26 fulfills various functions:
 control of the heating film 25 for wavelength setting,
 control of the amplification section 21 for gain setting or activation,
 control of the modulator 15 with the data to be transmitted,
 reception and processing of the signal detected by the photodetector 8.

The optical transceiver 1 described above makes it possible to perform the transmitted wavelength setting in a relatively simple manner, provided that the interval Δλ is accurately characterized and the error margin that has to be compensated by the setting is smaller than the interval Δλ. In this case in fact, it is sufficient to accurately control the setting of the wavelength received on a ray, for it is known that it is located at exactly a distance equal to the interval Δλ from the transmission wavelength.

For example, one possible procedure for tuning the laser to a given wavelength λ0 is:
 deactivate the laser,
 connect a calibrated source, with a wavelength that is calibrated to λ0+Δλ, to the port 3, and set the temperature of the ring 6 so as to maximize the intensity detected by the photodetector 8, remove the calibrated source and switch on the laser without changing the temperature setting of the ring 6.

Figure 4:
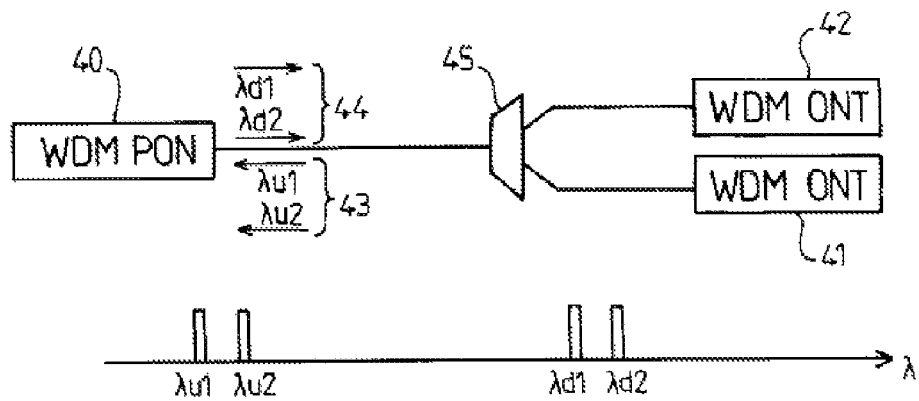
FIG. 4 is a functional schematic representation of an access network in which the optical transceiver can be used.

As illustrated in FIG. 4, the optical transceiver 1 described above can be used in client elements 41, 42 of a passive WDM optical network, communicating with a central station 40. Preferably, in the reception phase, the optical transceiver 1 is operated to receive a signal with a wavelength λd that is greater than the transmitted wavelength λu. This choice results from the fact that the best transmission zone of the optical fibers is located in the bottom of the wavelength bands envisaged for the passive WDM networks, and that it is easier and less costly to have more powerful sources on the side of the central station 40 than on the side of the client elements 41, 42.

In FIG. 4, the two client elements 41, 42 are provided with two identical transceivers designed as described above, in particular with exactly the same free spectral interval Δλ of the ring. The transceiver of the client element 41 is set to receive a predefined wavelength λd1 transmitted by the central station 40 and to transmit a predefined wavelength λu1=λd1−Δλ to the central station 40. Similarly, the transceiver of the client element 42 is set to receive a predefined wavelength λd2 also transmitted by the central station 40 and different from λd1 and to transmit a predefined wavelength λu2=λd2−Δλ to the central station 40. The multiplexing of the uplink signals 43 and the distribution of the downlink signals 44 can be performed very simply by a power coupler 45. In particular, no wavelength filter needs to be installed in the network.

The diagram of FIG. 4 can of course be produced with a greater number of client elements 42 each having two dedicated wavelengths separated by the same interval Δλ, for example for a total of 16 or 32 channels. Once the correct setting of the downlink wavelengths is acquired, the network can operate reliably without the risk of spectral collision between the uplink wavelengths.

For example, the carrier wavelengths of the passive network can be located in a band between 1.53 µm and 1.56 µm.

Figure 5:
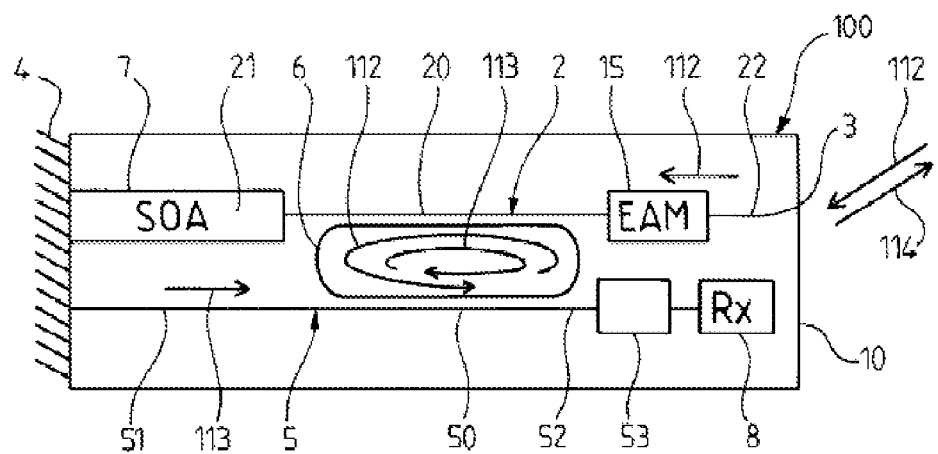
FIG. 5 is a functional schematic representation of an integrated optical transceiver according to another embodiment.

With reference to FIG. 5, another optical transceiver 100 capable of operating in simultaneous transmission and reception modes will be described. The elements identical to those of FIG. 1 bear the same reference numeral as in FIG. 1 and are not described again.

The embodiment of FIG. 5 is differentiated in that it comprises a spectral filter 53 arranged in the reception section 52 upstream of the photodetector 8. The filter 53 is chosen to allow the passage of the wavelength channel of the incoming signal 112 and block the wavelength channel of the resonant signal amplified by the amplification section 7, namely the outgoing signal 114. Thus, the device can transmit the laser signal 114 without disturbing the simultaneous reception of an incoming signal 112 by the photodetector 8. Preferably, the wavelength of the outgoing signal 114 is significantly lower than the wavelength of the incoming signal 112, and preferably situated around 1.3 µm to benefit from the low chromatic dispersion of the optical fibers at this value. The incoming signal is, for example, situated in a band between 1.5 and 1.6 µm, which is also a window of transparency of the optical fibers. For this, the filter 53 can be produced in the form of a band pass filter or of a low-pass filter, for example a low-pass filter obtained by integrating a negatively-biased semiconductor material in the reception section 52.

Figure 6:
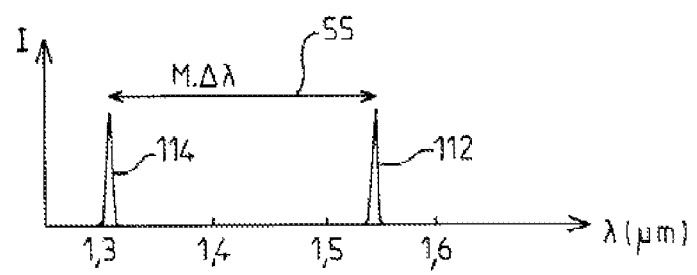
FIG. 6 is a graphic representation of the carrier wavelengths that can be transmitted and received by the optical transceiver of FIG. 5.

As shown in FIG. 6, because of the ring resonator 6, the difference between the wavelength of the outgoing signal 114 and the wavelength of the incoming signal 112 is equal to a positive integer multiple M of the free spectral interval Δλ.

Some of the elements represented, notably the control units, can be produced in different forms, in a unitary or distributed manner, by means of hardware and/or software components. Hardware components that can be used are application-specific integrated circuits ASIC, field-programmable gate arrays FPGA or microprocessors. Software components can be written in different programming languages, for example C, C++, Java or VHDL. This list is not exhaustive.

Although the invention has been described in conjunction with a number of particular embodiments, it is obvious that it is in no way limited thereto and that it comprises all the technical equivalents of the means described and their combinations provided that they fall within the framework of the invention.

The use of the verb "comprise" or "include" and its conjugate forms does not preclude the presence of other elements or of other steps than those described in a claim. The use of the indefinite article "a" or "one" for an element or a step does not preclude, unless otherwise stipulated, the presence of a plurality of such elements or steps.

In the claims, any reference sign between parentheses should not be interpreted as a limitation on the claim.

The invention claimed is:

1. An optical transceiver (1, 100) comprising:
   a ring resonator (6),
   a first waveguide (2) comprising, in succession, an input-output section, a coupling section (20) coupled to a first portion of the ring resonator and an amplification section (21) coupled to a first optical reflector (4), the first optical reflector being suitable for reflecting light toward the coupling section,
   a second waveguide (5) comprising, in succession, a reception section, a coupling section (50) coupled to a second portion of the ring resonator and a reflection section coupled to a second optical reflector (4), the second optical reflector being suitable for reflecting light toward the coupling section,
   a gain medium (7) arranged in the amplification section of the first waveguide and suitable for producing a stimulated light transmission, and
   an optical detector (8) coupled to the reception section of the second waveguide.

2. The optical transceiver as claimed in claim 1, also comprising a wavelength setting mechanism (25) suitable for modifying a physical property of the ring resonator to set the resonance frequency or frequencies of the ring resonator.

3. The optical transceiver as claimed in claim 2, in which the wavelength setting mechanism (25) is suitable for modifying the temperature of the ring resonator to change the refractive index of the ring resonator by thermo-optical effect.

4. The optical transceiver as claimed in claim 1, in which a spectral width of the gain medium (7) is less than the free spectral interval of the ring resonator (6).

5. The optical transceiver as claimed in claim 1, also comprising a substrate (10) on which the ring resonator, the first waveguide and the second waveguide are integrated in a monolithic manner.

6. The optical transceiver as claimed in claim 5, in which the substrate is made of silicon.

7. The optical transceiver as claimed in claim 5, also comprising a reflecting film (4) deposited on an end surface of the substrate and forming the first and second optical reflectors.

8. The optical transceiver as claimed in claim 1, also comprising an optical modulator (15) coupled to the first waveguide to modulate an optical signal generated by the gain medium.

9. The optical transceiver as claimed in claim 1, also comprising a control unit (26) suitable for controlling the gain of the gain medium and/or of other elements of the optical transceiver.

10. The optical transceiver (100) as claimed in claim 1, also comprising a spectral filter (53) arranged in the reception section (52) upstream of the optical detector (8) to allow the passage of an optical signal (112) to be received by the optical detector (8) and to block an optical signal (114) to be transmitted by the transceiver (100).

11. The optical transceiver as claimed in claim 10, in which the spectral filter (53) is a low-pass filter, the wavelength of the signal to be received (112) being greater than the wavelength of the signal to be transmitted (114).

12. A method for operating an optical transceiver, the method comprising:
providing a ring resonator (6);
providing a first waveguide (2) comprising, in succession, an input-output section, a coupling section (20) coupled to a first portion of the ring resonator and an amplification section (21) coupled to a first optical reflector (4), the first optical reflector being suitable for reflecting light toward the coupling section;
providing a second waveguide (5) comprising, in succession, a reception section, a coupling section (50) coupled to a second portion of the ring resonator and a reflection section coupled to a second optical reflector (4), the second optical reflector being suitable for reflecting light toward the coupling section;
providing a gain medium (7) arranged in the amplification section of the first waveguide and suitable for producing a stimulated light transmission, and
providing an optical detector (8) coupled to the reception section of the second waveguide, wherein:
in a transmitter operating mode, the gain medium (7) is activated and the optical transceiver transmits outward, through the input-output section, a monochromatic optical signal having a first carrier wavelength ($\lambda u1$), and
in a receiver operating mode, the gain medium (7) is deactivated and the optical transceiver receives, from the outside, through the input-output section, an optical signal comprising a monochromatic component having a second carrier wavelength ($\lambda d1$),
wherein the difference between the first carrier wavelength and the second carrier wavelength is equal to the free spectral interval ($\Delta\lambda$) of the ring resonator or an integer multiple thereof.

13. The operating method as claimed in claim 12, in which the input-output section (22) of the optical transceiver is linked by an optical network to a communication node (40), in which the monochromatic optical signal having the first carrier wavelength is modulated with an uplink data stream and transports the uplink data stream from the optical transceiver (1, 41) to the communication node (40), and in which the monochromatic component having the second carrier wavelength is modulated with a downlink data stream and transports the downlink data stream from the communication node (40) to the optical transceiver (1,41).

14. The operating method as claimed in claim 12, in which the transmitter operating mode and the receiver operating mode are used alternately according to a periodic time-division duplexing scheme.

15. The operating method as claimed in claim 12, in which the transmitter operating mode and the receiver operating mode are used simultaneously according to a spectral duplexing scheme.

* * * * *